United States Patent
Lee et al.

(10) Patent No.: US 9,755,593 B2
(45) Date of Patent: *Sep. 5, 2017

(54) METHOD FOR COMPENSATING A POWER AMPLIFICATION UNIT OF A WIRELESS RF MODULE

(71) Applicant: AIROHA TECHNOLOGY CORP., Hsinchu (TW)

(72) Inventors: Chien-Kuang Lee, Hsinchu (TW); Heng-Chih Lin, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/983,731

(22) Filed: Dec. 30, 2015

(65) Prior Publication Data

US 2016/0112087 A1    Apr. 21, 2016

Related U.S. Application Data

(63) Continuation of application No. 14/303,803, filed on Jun. 13, 2014, now Pat. No. 9,331,645.

(30) Foreign Application Priority Data

Nov. 22, 2013 (TW) .............................. 102142648 A

(51) Int. Cl.
| | |
|---|---|
| H04W 52/00 | (2009.01) |
| H03F 3/24 | (2006.01) |
| H03F 1/02 | (2006.01) |
| H03F 1/32 | (2006.01) |
| H03F 3/195 | (2006.01) |

(Continued)

(52) U.S. Cl.
CPC ............ *H03F 3/24* (2013.01); *H03F 1/0227* (2013.01); *H03F 1/0266* (2013.01); *H03F 1/3223* (2013.01); *H03F 3/19* (2013.01); *H03F 3/195* (2013.01); *H03F 3/21* (2013.01); *H04B 1/40* (2013.01); *H04W 52/226* (2013.01); *H03F 2200/451* (2013.01); *H03F 2200/555* (2013.01)

(58) Field of Classification Search
CPC ........................ H04W 52/367; H04W 52/50
USPC ............ 455/522, 127.1, 127.5, 114.3, 181.1, 455/182.1, 183.2
See application file for complete search history.

(56) References Cited

U.S. PATENT DOCUMENTS

| | | | |
|---|---|---|---|
| 9,077,405 B2 * | 7/2015 | Jones | H04B 1/0458 |
| 2007/0066250 A1 * | 3/2007 | Takahashi | H03G 3/3047 455/127.1 |
| 2014/0100002 A1 * | 4/2014 | Dupuis | H03G 3/3042 455/571 |

* cited by examiner

*Primary Examiner* — Ping Hsieh
(74) *Attorney, Agent, or Firm* — Rosenberg, Klein & Lee

(57) ABSTRACT

The present invention relates to a method for compensating a power amplification unit of a wireless RF module that includes a baseband unit, a RF transceiver unit, a power amplification unit and a control unit. The baseband unit is connected to the power amplification unit through the control unit and the RF transceiver unit. Based on the characteristic of the power amplification unit, the baseband unit provides a control signal to regulate the output signal characteristic of the power amplification unit, or provides a RF transceiver unit control signal to regulate the characteristics of the RF signal being transmitted by the RF transceiver unit to the power amplification unit, or to regulate the characteristics of the baseband signal being transmitted to the RF transceiver unit, enabling the characteristics of the (Continued)

output signal of the power amplification unit to meet the specifications of the related system.

5 Claims, 5 Drawing Sheets

(51) Int. Cl.
    *H03F 3/19*     (2006.01)
    *H03F 3/21*     (2006.01)
    *H04B 1/40*     (2015.01)
    *H04W 52/22*     (2009.01)

METHOD FOR COMPENSATING A POWER AMPLIFICATION UNIT OF A WIRELESS RF MODULE

CROSS REFERENCE TO RELATED APPLICATIONS

This non-provisional application claims priority claim under 35 U.S.C. §119(a) on Patent Application No. 102142648 filed Nov. 22, 2013 in Taiwan, and U.S. patent application Ser. No. 14/303,803 filed Jun. 13, 2014, the entire contents of which are incorporated herein by reference.

FIELD OF THE INVENTION

The present invention relates to a wireless RF module technology and more particularly, to a method for compensating a power amplification unit of a wireless RF module, which adjusts the output signal characteristics of the power amplification unit to meet the specifications of the related system, such as the requirement of the output power of the power amplification unit, or the output power-vs-time curve of the power amplification unit, or the signal spectrum, or ACLR (Adjacent Channel Leakage Ratio) or EVM (Error Vector Magnitude) or other related characteristics of the power amplification unit of the related system.

BACKGROUND OF THE INVENTION

Referring to FIG. 1, a block diagram of a conventional wireless RF module is shown. As illustrated, the wireless RF module 10 comprises a baseband unit 11, a RF transceiver unit 13, a control unit 15 and a power amplification unit 17, wherein the baseband unit 11 is electrically connected to the power amplification unit 17 through the RF transceiver unit 13 and the control unit 15.

The baseband unit 11 can transmit a control signal TRx_con and a baseband signal BB_sig to the RF transceiver unit 13, wherein the control signal TRx_con is adapted for controlling on/off, operating band selection or other related functions of the RF transceiver unit 13, or regulating the output power of the RF transceiver unit 13. The baseband signal BB_sig is adapted for transmitting a modulating signal associated with the system specifications to the RF transceiver unit 13 so that the RF transceiver unit 13 can up-convert the frequency of the baseband signal BB_sig to generate a RF signal. The RF transceiver unit 13 can further transmit the RF signal to the power amplification unit 17 where the power amplification unit 17 amplifies the received RF signal and then outputs the amplified RF signal.

The control unit 15 is electrically coupled with the power amplification unit 17, and adapted for controlling on/off and operating band selection of the power amplification unit 17, or regulating the output power of the power amplification unit 17. In actual application, the control unit 15 can control on/off and operating band selection of the power amplification unit 17 by changing the power supply voltage Vcc and/or bias voltage Vbias being provided to the power amplification unit 17, thereby regulating the output power of the power amplification unit 17 so that the power amplification unit 17 can properly amplify the RF signal being received from the RF transceiver unit 13.

The baseband unit 11 can transmit at least one control signal PA_con to the control unit 15, thereby controlling on/off and operating band selection of the power amplification unit 17. The baseband unit 11 can also transmit another power control signal Vramp to the control unit 15 to control the output power of the power amplification unit 17.

Currently, the industry has defined the power-vs-time curve of the power amplification unit 17 of the wireless RF module 10. For example, in GSM (Global System for Mobile Communications) system, the power-vs-time curve of the power amplification unit 17 must fall in a predetermined range.

However, in actual application, the output power characteristic of the power amplification unit 17 can be affected by many factors, such as the ambient temperature, the operating temperature and memory effect of the power amplification unit 17 and the bandwidth or frequency dependent characteristics of the power amplification unit 17, resulting in a discrepancy between the actual output power characteristic and the required output power characteristics of the power amplification unit 17.

In order to eliminate the aforesaid problem, the control unit 15 is controlled to adjust the power supply voltage Vcc and/or bias voltage Vbias being provided to the power amplification unit 17, thereby correcting or compensating the output power characteristics of the power amplification unit 17. However, in conventional RF module, the adjustment of the power amplification unit 17 from the control unit 15 is done by analog circuit. The adjustment achieved by analog circuit is more complex and less flexibility due to the complexity and process variation of the analog circuit. Therefore, the conventional method to adjust the characteristic power amplification unit 17 by analog circuit in the control unit 15 is not flexible for the wireless communication module. For example, an error can be easily occurred when the control unit 15 try to adjust the output power of the power amplification unit 17 through a power supply voltage Vcc and/or a bias voltage Vbias, causing some of the specification such as the power-vs-time curve of the power amplification unit 17 or the shape of the spectrum fail the specifications of GSM or other related systems.

SUMMARY OF THE PRESENT INVENTION

It is, therefore, the main object of the present invention to provide a method for compensating a power amplification unit of a wireless RF module, wherein the baseband unit is electrically connected to the power amplification unit through the control unit for sending a control signal to the power amplification unit, so that the power amplification unit can regulate the output signal characteristics according to the control signal. The baseband unit can send a control signal to power amplification unit based on the characteristics of the power amplification unit to control the output signal characteristics of the power amplification unit, such that the output signal characteristic of the power amplification unit, such as output power, the output power-vs-time curve, the output signal spectrum, ACLR (Adjacent Channel Leakage Ratio) and EVM (Error Vector Magnitude) and other signal characteristics of the power amplification unit, can meet the specifications of the related system. The characteristics of the power amplification unit includes all the variation of the power amplification unit, such as output power, the relationship between output power and the frequency, the relationship between output power and time, the relationship between output power and temperature, memory effect characteristics, linearity characteristics and bias vs. (versus) output signal characteristics of the power amplification unit.

It is another object of the present invention to provide a method for compensating a power amplification unit of a wireless RF module, wherein the baseband unit is electrically connected to the power amplification unit through the RF transceiver unit for sending a control signal to the RF transceiver unit so that the RF transceiver unit can regulate the signal characteristics of the RF signal being sent to the power amplification unit. The baseband unit regulates the control signal based on the characteristics of the power amplification unit so that the RF signal being transmitted by the RF transceiver unit to the power amplification unit can have a different strength or a different modulated signal characteristics, such that the output signal characteristic of the power amplification unit, such as the output power, the output power-vs-time curve, the output signal spectrum, ACLR (Adjacent Channel Leakage Ratio) and EVM (Error Vector Magnitude) and other signal characteristics of the power amplification unit, to meet the specifications of the related system.

It is still another object of the present invention to provide a method for compensating a power amplification unit of a wireless RF module, which enables the baseband unit to converts the digital control signal into an analog control signal through a digital to analog converter (DAC) based on the characteristics of the power amplification unit, and then to transmit the analog control signal for controlling and compensating the variation of the power amplification unit, thereby accurately control the output signal characteristics of the power amplification unit, such that the output signal characteristic of the power amplification unit, such as the output power, the output power-vs-time curve, the output signal spectrum, ACLR (Adjacent Channel Leakage Ratio) and EVM (Error Vector Magnitude) and other signal characteristics of the power amplification unit, can meet the specifications of the related system.

It is still another object of the present invention to provide a method for compensating a power amplification unit of a wireless RF module, which is to get or measure the characteristics of the power amplification unit at first, and then to regulate the characteristics of the output signal of the power amplification unit based on the obtained characteristics, such that the output signal characteristic of the power amplification unit, such as the output power, the output power-vs-time curve, the output signal spectrum, ACLR (Adjacent Channel Leakage Ratio) and EVM (Error Vector Magnitude) and other signal characteristics of the power amplification unit, to meet the specifications of the related system.

To achieve these and other objects of the present invention, the present invention provides a method for compensating a power amplification unit of a wireless RF module comprising a baseband unit, a RF transceiver unit, a control unit and a power amplification unit. The baseband unit is electrically connected to the power amplification unit through the control unit and the RF transceiver unit. The method comprises the step of obtaining the characteristics of the power amplification unit including the output power of the power amplification unit, the characteristics of the output power of the power amplification unit relative to frequency and time and the temperature characteristics, memory effect characteristics, linearity characteristics and bias vs. output signal characteristics of the power amplification unit, the step of setting the characteristic of the power amplification unit in the baseband unit, the step of enabling the baseband unit to send at least one control signal to the control unit based on the characteristics of the power amplification unit, and the step of enabling the control unit to regulate output signal characteristics of the power amplification unit subject to the control signal so as to let the output signal characteristics of the power amplification unit, such as output power, output power-vs-time curve, the output signal spectrum, ACLR (Adjacent Channel Leakage Ratio) and EVM (Error Vector Magnitude) of the power amplification unit, meet the specifications of the related system.

In one embodiment of the method for compensating a power amplification unit of a wireless RF module, further comprises the step of establishing a lookup table based on the characteristics of the power amplification unit.

In one embodiment of the method for compensating a power amplification unit of a wireless RF module, further comprises the step of establishing an equivalent behavioral model based on the characteristics of the power amplification unit.

In one embodiment of the method for compensating a power amplification unit of a wireless RF module, further comprises the step of enabling the baseband unit to regulate the control signal being sent to the control unit based on the lookup table or the equivalent behavioral model.

In one embodiment of the method for compensating a power amplification unit of a wireless RF module, further comprises the step of enabling the RF transceiver unit to transmit a RF signal to the power amplification unit.

In one embodiment of the method for compensating a power amplification unit of a wireless RF module, comprises the step of enabling the baseband unit to regulate the at least one RF transceiver unit control signal and/or baseband signal being transmitted to the RF transceiver unit based on the lookup table or equivalent behavioral model so as to further regulate the strength of the output signal of the RF transceiver unit or the characteristics of the modulated signal in matching the characteristics of the power amplification unit, and thus the output signal of the power amplification unit can meet the specifications of the related system.

In one embodiment of the method for compensating a power amplification unit of a wireless RF module, further comprises the step of enabling the baseband unit to get at least one operating information from the power amplification unit.

In one embodiment of the method for compensating a power amplification unit of a wireless RF module, further comprises the step of enabling the baseband unit to regulate each control signal being sent to the control unit based on the at least one operating information of the power amplification unit and the lookup table or equivalent behavioral model.

In one embodiment of the method for compensating a power amplification unit of a wireless RF module, the characteristics of the power amplification unit comprises the output power of the power amplification unit, and/or the relationship of the output power of the power amplification unit relative to time and/or frequency, and/or the temperature characteristics and/or memory effect characteristics and/or linearity characteristics and/or bias vs. output signal characteristics of the power amplification unit, and/or the relationship of the output power of the power amplification unit relative to the frequency or bandwidth of the received RF signal.

In one embodiment of the method for compensating a power amplification unit of a wireless RF module, further comprises the step of enabling the baseband unit to regulate the at least one RF transceiver unit control signal and/or the baseband signal being transmitted to the RF transceiver unit based on the lookup table or equivalent behavioral model and the characteristics and operating information of the power amplification unit, so as to further regulate the strength of the output signal of the RF transceiver unit or the characteristics of the modulated signal in matching the characteristics of the power amplification unit, and thus the output signal characteristics of the power amplification unit can meet the specifications of the related system.

In one embodiment of the method for compensating a power amplification unit of a wireless RF module, the at least one control signal comprises a power control signal and/or a power amplification unit control signal.

In one embodiment of the method for compensating a power amplification unit of a wireless RF module, the at least one control signal comprises at least one digital signal and/or at least one analog signal.

In one embodiment of the method for compensating a power amplification unit of a wireless RF module, the baseband unit comprises a digital to analog converter (DAC) adapted for converting each control signal into an analog signal and then sending the converted analog signal to the control unit and/or RF transceiver.

Other advantages and features of the present invention will be fully understood by reference to the following specification in conjunction with the accompanying drawings, in which like reference signs denote like components of structure.

DETAILED DESCRIPTION OF THE PREFERRED EMBODIMENTS

Figure 1:
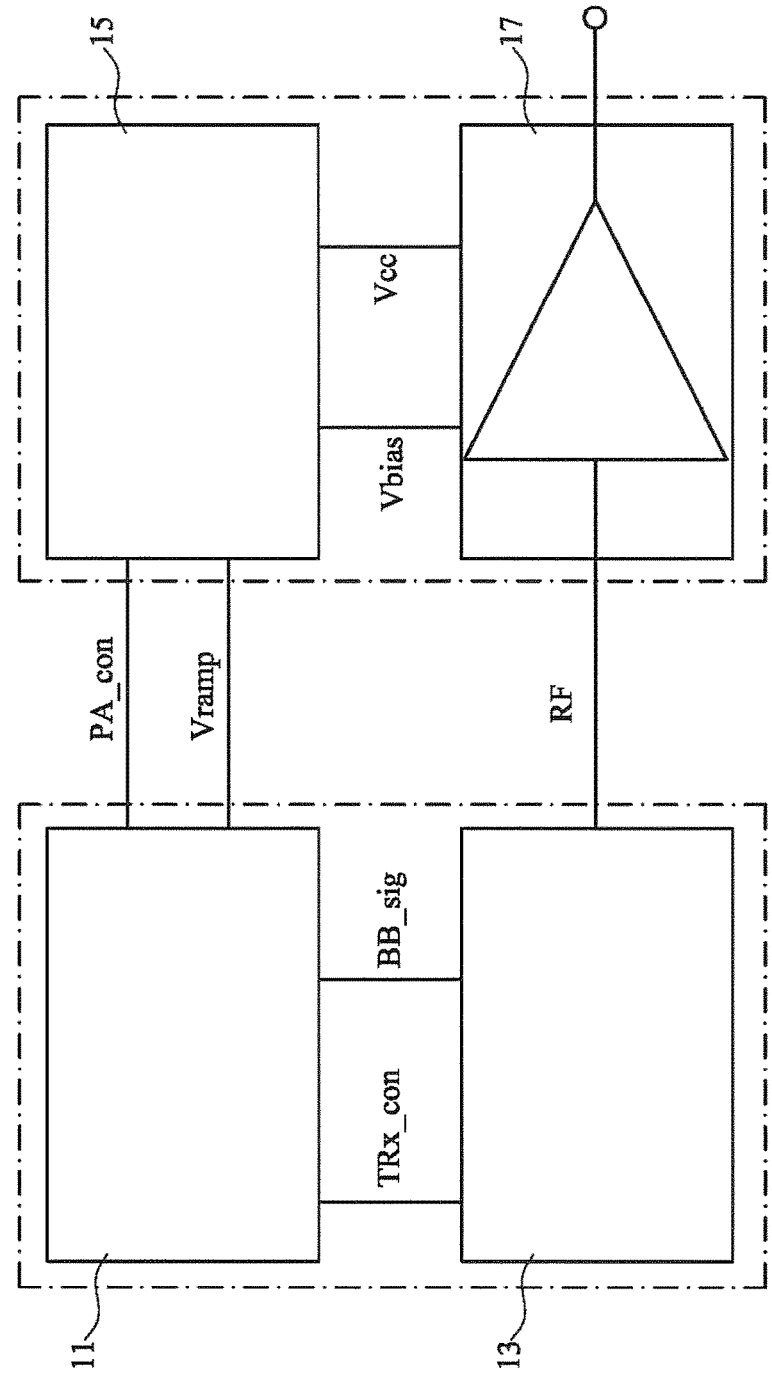
FIG. 1 is a circuit block diagram of a wireless RF module according to the prior art.
Figure 2:
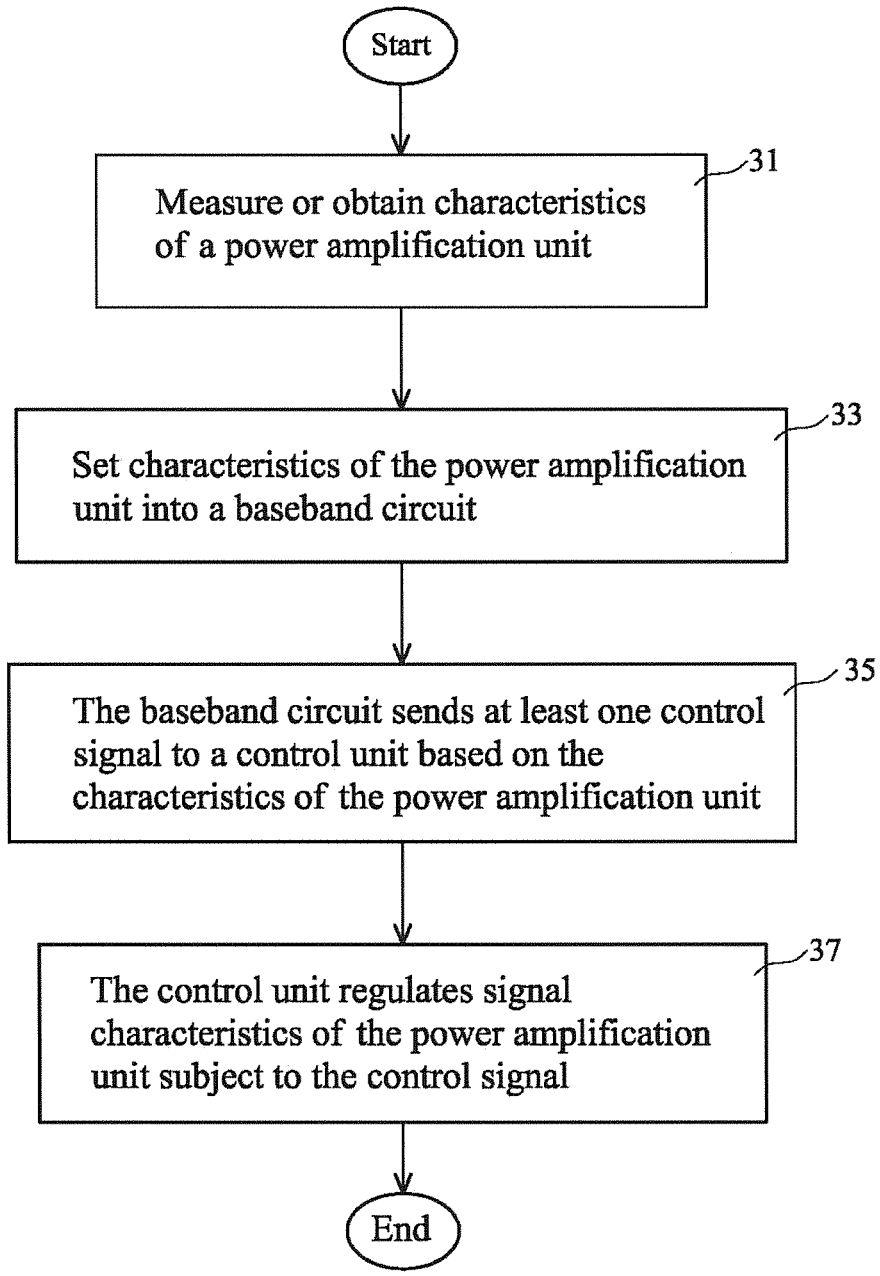
FIG. 2 is a flow chart of a method for compensating a power amplification unit of a wireless RF module in accordance with the present invention.
Figure 3:
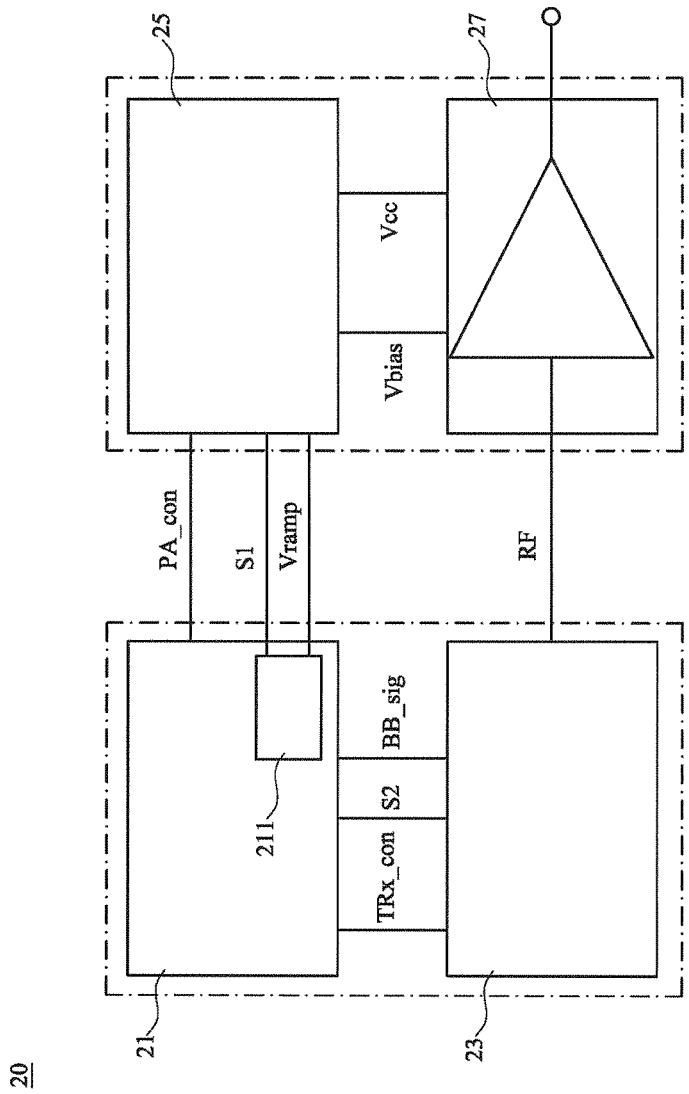
FIG. 3 is a circuit block diagram of a wireless RF module in accordance with the present invention.

Please refer to FIG. 2, a flow chart of a method for compensating a power amplification unit of a wireless RF module in accordance with the present invention is shown. Please referring also to FIG. 3, the RF front-end module 20 comprises a baseband unit 21, a RF transceiver unit 23, a control unit 25, and a power amplification unit 27, wherein the baseband unit 21 is electrically connected to the power amplification unit 27 through the control unit 25, and also electrically connected to the power amplification unit 27 through the RF transceiver unit 23.

The baseband unit 21 is adapted to transmit a baseband signal BB_sig to the connected RF transceiver unit 23. The RF transceiver unit 23 is adapted to up-convert the frequency of the baseband signal BB_sig so as to generate a RF signal, and then to transmit the RF signal to the power amplification unit 27 for RF signal amplification.

In this embodiment, the baseband unit 21 is capable of transmitting a transmitter control signal TRx_con and/or a RF transceiver unit control signal S2 to the connected RF transceiver unit 23, so that the RF transceiver unit 23 can regulate or modify the signal strength or output power and/or other signal characteristics of the RF signal transmitted to the power amplification unit 27. Further, the transmitter control signal TRx_con and the RF transceiver unit control signal S2 can be digital control signals or analog control signals.

In this embodiment, the baseband unit 21 can control and modify the baseband signal BB_sig to be transmitted to the RF transceiver unit 23 based on the characteristics of the power amplification unit 27, regulating or modulating the signal strength or output power and/or other signal characteristics of the RF signal transmitted to the power amplification unit 27.

The control unit 25 is adapted to regulate the output signal characteristics of the power amplification unit 27, for example, to modify the supply voltage of the power amplification unit 27 via Vcc, and/or to modify the bias of the power amplification unit 27 via Vbias, thereby regulating the output signal characteristics of the power amplification unit 27. In this embodiment, the baseband unit 21 is capable of sending at least one control signal to the control unit 25, enabling the control unit 25 to regulate the output signal characteristics of the power amplification unit 27 subject to the received at least control signal.

In this embodiment, the control signal can be the original control signal PA_con and/or a control unit control signal S1 and/or a power control signal Vramp. Further, the control signal PA_con, the control unit control signal S1 and the power control signal Vramp can be digital signals or analog signals. After received the control unit control signal S1 and/or the power control signal Vramp from the baseband unit 21, the control unit 25 will regulate the output signal characteristics of the power amplification unit 27 subject to the received control unit control signal S1 and/or power control signal Vramp.

In this embodiment, the baseband unit 21, the RF transceiver unit 23, the control unit 25 and the power amplification unit 27 can be independent components or chips. However, the baseband unit 21, the RF transceiver unit 23, the control unit 25 and/or the power amplification unit 27 can be also integrated by different chip combination. For example, as illustrated in the imaginary lines in FIG. 3, the baseband unit 21 and the RF transceiver unit 23 can be integrated into one single chip, the control unit 25 and the power amplification unit 27 can be integrated into another single chip or module. Alternatively, the baseband unit 21, the RF transceiver unit 23, the control unit 25 and the power amplification unit 27 can be integrated into one single chip.

In this embodiment, prior to compensating the power amplification unit 27 of the wireless RF module 20, it is necessary to get the characteristics of the power amplification unit 27, for example, to measure the characteristics of the power amplification unit 27, such as the output power range of the power amplification unit 27, and/or the characteristic of the output power of the power amplification unit 27 relative to temperature, and/or the characteristic of the output power of the power amplification unit 27 relative to frequency, and/or the changes in the characteristics of the output power of the power amplification unit 27 versus time, and/or the bandwidth of the power amplification unit 27, and/or the memory effect characteristics of the power amplification unit 27, and/or the linearity characteristics of the power amplification unit 27, and/or the bias vs. (versus) output signal characteristics of the power amplification unit 27, as illustrated in Step 31.

Thereafter, proceed to Step 33 of setting the characteristics of the power amplification unit 27 into the baseband unit 21. In actual application, this step can be achieved by: establishing a lookup table subject to the characteristics of the power amplification unit 27 or establishing an equivalent behavioral model close to the characteristics of the power amplification unit 27, and then storing the established lookup table or equivalent behavioral model in the baseband unit 21 or linking the established lookup table or equivalent behavioral model to the baseband unit 21, enabling the baseband unit 21 to get the characteristics of the power amplification unit 27 from the lookup table or equivalent behavioral model and then to regulate the control signal being sent to the control unit 25.

The baseband unit 21 can send at least one control signal to the control unit 25 based on the characteristics of the power amplification unit 27, wherein the at least one control signal comprises the original control signal PA_con and/or the control unit control signal S1 and/or the power control signal Vramp, as illustrated in Step 35.

After received the control signal from the baseband unit 21, the control unit 25 will regulate the output signal characteristics of the power amplification unit 27 subject to the nature of the received control signal, modifying the output signal characteristics of the power amplification unit 27, such as output power range, output power-vs-time curve, the signal spectrum shape, ACLR (Adjacent Channel Leakage Power Rate), EVM (Error Vector Magnitude) to meet the specifications of the related system, such as GSM (Global System for Mobile Communications) or WCDMA (Wideband Code Division Multiple Access) or LTE (Long Term Evolution) system, as illustrated in Step 37.

In this embodiment, the baseband unit 21 comprises a digital to analog converter (DAC) 211. Through the digital to analog converter (DAC) 211, the baseband unit 21 can transmit an analog control signal S1 and an analog power control signal Vramp to the control unit 25 so that the baseband unit 21 can accurately control the output signal characteristics of the output signal of the power amplification unit 27 via the control unit 25.

The output power of the power amplification unit 27 can be changed due to the operating temperature variation during actual application. For example, when the operating temperature rises, the output power of the power amplification unit 27 can be increased or reduced. This temperature variation may cause the output power-vs-time curve of the power amplification unit 27 to extend out of a predetermined range. At this time, the baseband unit 21 can regulate the control unit control signal S1 and/or power control signal Vramp being sent to the control unit 25 based on the characteristics of the power amplification unit 27 or the lookup table or equivalent behavioral model, adjusting the power-vs-time curve of the power amplification unit 27 to fall within a predetermined range.

After the baseband unit 21 sent the control unit control signal S1 and/or power control signal Vramp to the control unit 25, the control unit 25 regulates the Vcc and/or Vbias being sent to the power amplification unit 27 based on the control unit control signal S1 and/or power control signal Vramp. Then the output signal characteristics of the power amplification unit 27 can be adjusted based on the supply voltage Vcc and/or bias Vbias. As the invention regulates the output signal characteristics of the power amplification unit 27 by the control unit control signal S1 and/or power control signal Vramp, the baseband unit 21 can accurately control the output signal characteristics of the power amplification unit 27 via the control unit 25.

Figure 4A:
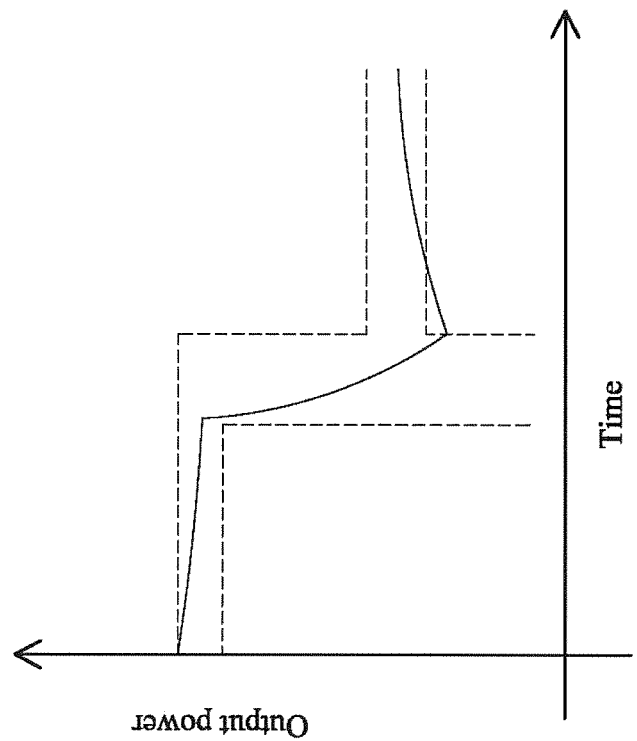
FIG. 4A is a Vramp-vs-time curve of the power control signal of the regular baseband unit of the wireless RF module according to the prior art.

In the example of regulating the power control signal Vramp being provided by the baseband unit 21 to the control unit 25, the power control signal Vramp provided by the baseband unit 21 to the control unit 25 is normally close to a square wave, as illustrated in FIG. 4A. When the output power of the power amplification unit 27 varies with the operating temperature, the power-vs-time curve of the output power of the power amplification unit 27 will extend out of the predetermined range, as illustrated in FIG. 4B where the real line illustrates the power-vs-time curve of the output power of the power amplification unit 27; the imaginary line illustrates the curve defined a power-vs-time specification subject to, for example, GSM (Global System for Mobile Communications).

Figure 4B:
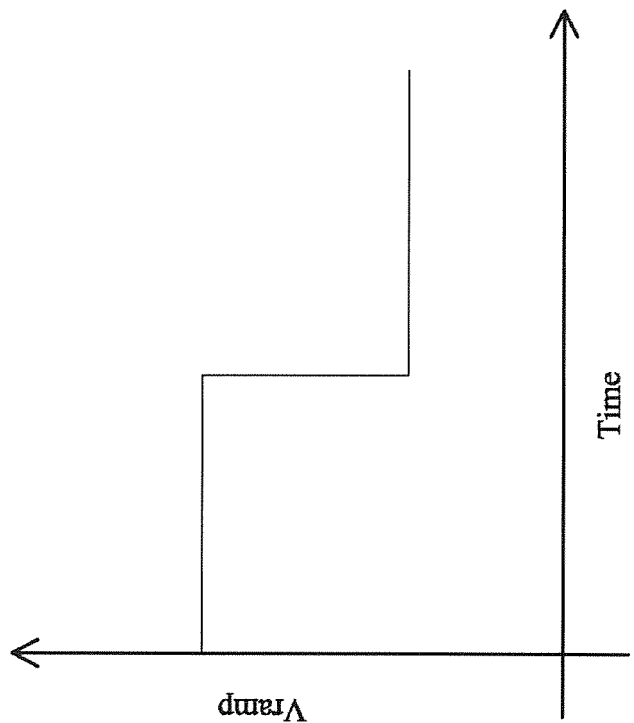
FIG. 4B is a power-vs-time curve of the regular power amplification unit of the wireless RF module according to the prior art.
Figure 5A:
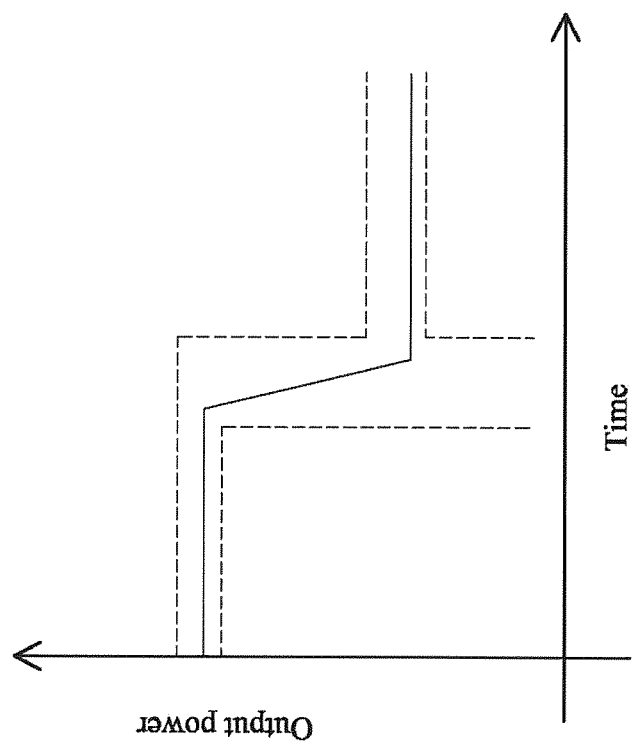
FIG. 5A is a Vramp-vs-time curve of the power control signal of the baseband unit of the wireless RF module in accordance with the present invention.
Figure 5B:
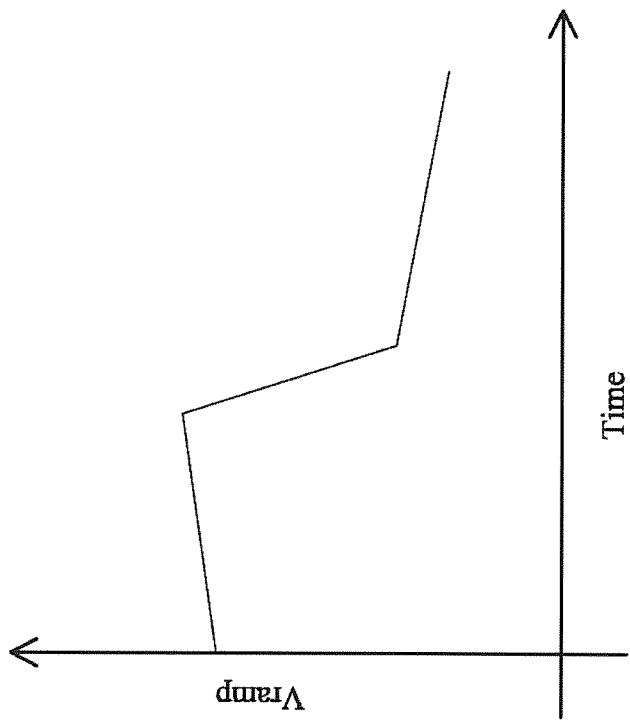
FIG. 5B is a power-vs-time curve of the power amplification unit of the wireless RF module in accordance with the present invention.

To compensate the power variation due to temperature characteristics of the power amplification unit illustrated in FIG. 4B, in this embodiment, the baseband unit 21 can regulate the power control signal Vramp based on the characteristics of the power amplification unit 27 or the lookup table or equivalent behavioral model that was established based on the characteristics of the power amplification unit 27, adjusting the waveform of the power control signal Vramp provided by the baseband unit 21 to the control unit 25 to be as illustrated in FIG. 5A. At this time, the power control signal Vramp resembles a sawtooth voltage waveform. Because the baseband unit 21 has regulated the power control signal Vramp based on the characteristics of the power amplification unit 27 or the lookup table or equivalent behavioral model that was established based on the characteristics of the power amplification unit 27, the power-vs-time curve of the output power of the power amplification unit 27 will fall in the predetermined range as illustrated in FIG. 5B. In FIG. 5B, the real line illustrates the power-vs-time curve of the output power of the power amplification unit 27; the imaginary line illustrates the curve defined a power-vs-time specification subject to, for example, GSM (Global System for Mobile Communications).

Further, the baseband unit 21 can regulate the control unit control signal S1 being transmitted to the control unit 25 based on the characteristics of the power amplification unit 27 or the lookup table or equivalent behavioral model that was established subject to the characteristics of the power amplification unit 27, and the control unit 25 will regulate the output signal characteristics of the power amplification unit 27 subject to the received control unit control signal S1, adjusting the power-vs-time curve of the output power of the power amplification unit 27 to fall within the predetermined range.

The output power variation due to temperature can also be compensated by adjusting the input signal characteristics of the power amplification unit 27. In another embodiment of the present invention, the baseband unit 21 can regulate the signal characteristics of the RF signal being transmitted to the power amplification unit 27 by regulating the RF transceiver unit control signal S2 and/or the baseband signal BB sig being transmitted to the connected RF transceiver unit 23 based on the characteristics of the power amplification unit 27 or the lookup table or equivalent behavioral model that was established based on the characteristics of the power amplification unit 27, adjusting the power-vs-time curve of the output power of the power amplification unit 27 to fall within the predetermined range. If the temperature characteristic of the power amplification unit 27 causes the output power of the power amplification unit 27 to be decreased with increasing temperature, the baseband unit 21 can, by means of the RF transceiver unit control signal S2, control the RF transceiver unit 23 to increase the signal strength or output power of the RF signal being transmitted by the RF transceiver unit 23 to the power amplification unit 27, or directly increase the signal strength of the baseband signal BB_sig so as to increase the signal strength or output power of the RF signal being transmitted by the RF transceiver unit 23 to the power amplification unit 27 when the output power of the power amplification unit 27 decreases due to an operating temperature rise. On the contrary, if the temperature characteristic of the power amplification unit 27 causes the output power of the power amplification unit 27 to be increased with increasing temperature, the baseband unit 21 can, by means of the RF transceiver unit control signal S2, control the RF transceiver unit 23 to reduce the signal strength or output power of the RF signal being transmitted by the RF transceiver unit 23 to the power amplification unit 27, or directly reduce the signal strength of the baseband signal BB_sig so as to reduce the strength of the RF signal being transmitted by the RF transceiver unit 23 to the power amplification unit 27 when the output power of the power amplification unit 27 increases due to an operating temperature rise. Therefore, the output power variation of the power amplification unit 27 can be kept small and meet the related specification of the communication system, such as GSM or WCDMA or LTE system.

In another embodiment of the present invention, the baseband unit 21 can simultaneously regulate the signal strength of the output power of the power amplification unit 27 by regulating the power control signal Vramp and/or the control unit control signal S1 and/or the RF transceiver unit control signal S2 and/or the baseband signal BB_sig based on the characteristics of the power amplification unit 27 or the lookup table or equivalent behavioral model that was established based on the characteristics of the power amplification unit 27, adjusting the power-vs-time curve of the output power of the power amplification unit 27 to fall within the predetermined range.

In one embodiment of the present invention, the baseband unit 21 can get or estimate the operating information of the power amplification unit 27 such as the operating temperature of the power amplification unit 27 and/or the frequency and/or bandwidth of the received RF signal through the power amplification unit 27, the RF transceiver unit 23 and/or an external system and/or the baseband unit 21 itself, and then regulate the output signal characteristics of the power amplification unit 27 based on the operating information and other characteristics of the power amplification unit 27 to meet the related specification of the communication system, such as GSM or WCDMA or LTE system Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A method for compensating a power amplification unit of a wireless RF module comprising a baseband unit, a RF transceiver unit, a control unit and a power amplification unit, said baseband unit being electrically connected to said power amplification unit through said control unit and said RF transceiver unit, the method comprising the steps of:

obtaining at least one characteristic of said power amplification unit, wherein said at least one characteristic comprises the output power of said power amplification unit;

setting said characteristic of said power amplification unit in said baseband unit;

establishing a lookup table or an equivalent behavioral model based on said characteristic of said power amplification unit;

enabling said RF transceiver unit to transmit a RF signal to said power amplification unit;

enabling said baseband unit to regulate at least one RF transceiver unit control signal being sent to said RF transceiver unit based on said lookup table or said equivalent behavioral model; and enabling said RF transceiver unit to regulate the characteristics of said RF signal subject to said RF transceiver unit control signal.

2. The method as claimed in claim 1, further comprising the step of enabling said baseband unit to get at least one operating information from said power amplification unit, wherein said operating information comprises the operating temperature of said power amplification unit or the frequency or the bandwidth of said power amplification unit.

3. The method as claimed in claim 1, further comprising the steps of:

enabling said baseband unit to get at least one operating information from said power amplification unit; and enabling said baseband unit to regulate said RF transceiver unit control signal being sent to said RF transceiver unit based on said operating information of said power amplification unit.

4. A method for compensating a power amplification unit of a wireless RF module comprising a baseband unit, a RF transceiver unit, a control unit and a power amplification unit, said baseband unit being electrically connected to said power amplification unit through said control unit and said RF transceiver unit, the method comprising the steps of:

obtaining at least one characteristic of said power amplification unit, wherein said at least one characteristic comprises the output power of said power amplification unit;

setting said characteristic of said power amplification unit in said baseband unit;

establishing a lookup table or an equivalent behavioral model based on said characteristic of said power amplification unit;

enabling said RF transceiver unit to transmit a RF signal to said power amplification unit; and enabling said baseband unit to regulate the characteristics of a baseband signal being transmitted to said RF transceiver unit based on said lookup table or said equivalent behavioral model.

5. The method as claimed in claim 4, further comprising the step of enabling said baseband unit to get at least one operating information from said power amplification unit, wherein said operating information comprises the operating temperature of said power amplification unit or the frequency or the bandwidth of said power amplification unit.

* * * * *